United States Patent [19]
Kim

[11] Patent Number: 5,812,464
[45] Date of Patent: Sep. 22, 1998

[54] COLUMN SELECT SIGNAL CONTROL CIRCUITS AND METHODS FOR INTEGRATED CIRCUIT MEMORY DEVICES

[75] Inventor: Chul-Soo Kim, Kyungki-do, Rep. of Korea

[73] Assignee: Samsung Electronics Co., Ltd., Suwon, Rep. of Korea

[21] Appl. No.: 748,196

[22] Filed: Nov. 12, 1996

[30] Foreign Application Priority Data

Nov. 13, 1995 [KR] Rep. of Korea ................... 40994/1995

[51] Int. Cl.⁶ ..................................................... G11C 7/00
[52] U.S. Cl. .......................................... 365/194; 365/193
[58] Field of Search ............................. 365/194, 230.06, 365/193, 191

[56] References Cited

U.S. PATENT DOCUMENTS

| | | | |
|---|---|---|---|
| 5,319,253 | 6/1994 | You | 365/194 |
| 5,357,479 | 10/1994 | Matsui | 365/230.06 |
| 5,379,261 | 1/1995 | Jones, Jr. | 365/230.01 |
| 5,384,745 | 1/1995 | Konishi et al. | 365/230.03 |
| 5,386,385 | 1/1995 | Stephens, Jr. | 365/189.05 |
| 5,521,879 | 5/1996 | Takasugi | 365/233 |
| 5,550,784 | 8/1996 | Takai | 365/233 |

*Primary Examiner*—David C. Nelms
*Assistant Examiner*—Michael T. Tran
*Attorney, Agent, or Firm*—Myers Bigel Sibley & Sajovec

[57] ABSTRACT

Column select circuits and methods for read/write memory devices logically combine and delay an enable signal and a read/write control signal, to produce a column select control signal which has a first enable interval during a read operation and a second enable interval during a write operation. The first enable interval is preferably shorter than the second enable interval. The column select control signal preferably ends at the same time for both the read and write operations, but begins at different times for the read and write operations. Accordingly, the enable interval for the control signal can be different during read and write operations, to allow sufficient time for each of these operations while increasing access speed and preventing errors.

18 Claims, 4 Drawing Sheets

COLUMN SELECT SIGNAL CONTROL CIRCUITS AND METHODS FOR INTEGRATED CIRCUIT MEMORY DEVICES

FIELD OF THE INVENTION

This invention relates to integrated circuit memory devices, and more particularly to selection circuits and methods for integrated circuit memory devices.

BACKGROUND OF THE INVENTION

Integrated circuit memory devices are widely used in consumer and commercial applications. As is well known to those having skill in the art, many integrated circuit memory devices are read/write memory devices, in which data can be read from the memory device and written into the memory device. As is also well known to those having skill in the art, an integrated circuit memory device typically includes an array of memory cells which store data, and peripheral circuits which control input and output of the data stored in the memory cell array.

Memory cells in a memory cell array are generally arranged in a matrix of rows and columns. In order to read from or write to a memory cell, the cell is addressed by its row and column. A row address is used to select a row from the plurality of rows, and a column address is used to select a column from a plurality of columns. The row address and column address may be obtained by sharing an external address signal in a technique which is referred to as "address multiplexing".

FIG. 1 is a schematic block diagram of a portion of an integrated circuit memory cell array. Referring to FIG. 1, operations for accessing a memory cell will now be described. In general, a pair of bit lines are precharged in a precharge operation which is performed by a precharge and equalizing circuit 12. Generally, the potential level of a pair of bit lines BLi and $\overline{BLi}$ is charged to one-half $V_{cc}$, wherein $V_{cc}$ is a power supply voltage for the integrated circuit.

When a read operation begins, the precharge and equalizing circuit is generally disabled. Then, when a row address signal is obtained from a row address buffer (not shown) and a decoding operation of a row decoder is executed, a predetermined row corresponding to the row address is activated, by activating a predetermined word line. In FIG. 1, it is assumed that word line WLi is activated.

When the word line WLi is activated, charge sharing occurs between the cell data stored in the memory cell 10 and charge stored in the parasitic capacitance of the precharged bit lines BLi and $\overline{BLi}$. As a result of this charge sharing, a potential difference is generated between the bit lines BLi and $\overline{BLi}$. This potential difference is generally small, on the order of several tens or several hundreds of millivolts. The potential difference between the bit lines BLi and $\overline{BLi}$ is sensed by the sense amplifier 14 and is converted into appropriate $V_{cc}$ and $V_{ss}$ levels.

A column address signal is decoded by a column decoder (not shown) and a column select signal CSL is generated at the controlling electrodes of column select gates 16 and 18. This activates the column select gates 16 and 18. Since column select gates 16 and 18 are connected to the respective bit lines BLi and $\overline{BLi}$, the data on the bit line pair is transmitted to the input/output line pair IO and $\overline{IO}$. The data which is transmitted by the input/output line pair IO and $\overline{IO}$ is then sensed by another input sense amplifier (not shown in FIG. 1), and is thereby transmitted outside the integrated circuit by output circuits (not shown).

For a write operation, data is stored in a predetermined memory cell 10 in a manner which is opposite to the above-described read operation, as is well known to those having skill in the art. However, generally, when a write operation is performed, the input sense amplifier does not need to operate.

FIG. 2 is a logic block diagram which illustrates a conventional column select signal control circuit. A control signal φCP is produced by the column select signal control circuit. The control signal φCP determines the activation of the column select signal CSL which is provided to the controlling electrodes of the column select gates 16 and 18.

As shown in FIG. 2, the column select signal control circuit is controlled by an enable signal φCPE. The enable signal φCPE is connected to the input terminal of inverter 22, the output of which is connected to input terminal of inverter 24. The output terminal of inverter 24 is connected to the input terminal of a pulse generating circuit 26, the output terminal of which is connected to the input terminal of inverter 38. The output terminal of inverter 38 is coupled to the input terminal of inverter 40 to produce the control signal φCP. The pulse generating circuit 26 is formed by NAND gate 36 and inverters 28, 30, 32, 34 and 35.

FIG. 3 is a timing diagram illustrating operations of the circuit of FIG. 2. As shown in FIG. 3, when the enable signal φCPE is activated by the combination of an external clock signal CLK and column predecoding information, the control signal φCP is provided as a pulse signal. The control signal φCP is input to the column predecoder and controls a decoding time period of the predetermined bit of the column address signal, thereby outputting a predetermined width of the column address signal predecoded from the column decoder. The predetermined bit is generally used as the most significant bit (MSB) with two or three bits. The predecoded column address signal is then decoded in the column decoder, with the remaining column address, except for the most significant bit, and is output as the column select signal CSL, which designates a predetermined column select gate 16 and 18, as shown in FIG. 1.

Conventional column predecoders and column decoders are shown in FIGS. 6 and 7 respectively. Since column predecoders and column decoders are well known to those having skill in the art, they need not be described further herein. However, it should be noted that during the read and write operations, the column select signal CSL has the same activation interval.

As is well known to those having skill in the art, the timing of the column select signal CSL can impact the performance of the read and write operations in an integrated circuit memory device. The interval for read/write operations may depend upon the precharge time of the input/output line pair and the enable time of the input sense amplifier. If the enable time of the column select signal CSL and the precharge time of the input/output line pair are insufficient, the access time may be impacted. In other words, if insufficient enable time for the column select signal CSL is not provided, a reduction in access time may be produced and improper read/write operations may be provided. For example, during a high frequency write operation, valid data on the input/output line pair may not be transmitted to the bit line pair, which can cause improper write operations. Accordingly, there continues to be a need for improved column select signal control circuits and methods which can provide proper timing for read/write operations.

SUMMARY OF THE INVENTION

It is therefore an object of the present invention to provide integrated circuit memory devices and operational methods which can provide proper timing for column select signals in read and write operations.

It is yet another object of the present invention to provide column select signal circuits and methods for integrated circuit memory devices which can provide high speed operations without extending data access times.

These and other objects are provided, according to the present invention, by column select circuits and methods for read/write memory devices wherein an enable signal and a read/write control signal are logically combined and delayed to produce a column select control signal which has a first enable interval during a read operation and second enable interval during a write operation. Preferably, the first enable interval is shorter than the second enable interval, so that a longer write enable interval may be provided. The column select control signal preferably ends at the same time for both the read and write operations, but begins at different times for the read and write operations.

A preferred column select circuit for a read/write memory device according to the present invention, includes a first delay circuit which is responsive to an enable signal to delay the enable signal. A second delay circuit is responsive to the enable signal and to a write control signal, to logically combine the enable signal and the write control signal and to delay the logically combined enable signal and write control signal. A first combinatorial circuit is responsive to the first delay circuit and to the second delay circuit, to logically combine the outputs of the first and second delay circuits.

A third delay circuit is responsive to the first combinatorial circuit to delay the output of the first combinatorial circuit. A fourth delay circuit is responsive to the write control circuit and to the first combinatorial circuit, to logically combine the write control signal and the output of the first combinatorial circuit and to delay the logically combined write control signal and the output of the first combinatorial circuit. A second combinatorial circuit is responsive to the third delay circuit and to the fourth delay circuit, to logically combine the outputs of the third and fourth delay circuits. An output circuit is responsive to the first and second combinatorial circuits, to logically combine the outputs of the first and second combinatorial circuits, to thereby produce a column select control signal which is responsive to the write control signal as well as to the enable signal.

In a preferred embodiment of the present invention, the delays of at least one of the first, second, third and fourth delay circuits are selected to produce a column select control signal which has a first enable interval during a read operation and second enable interval during a write operation. The first enable interval is preferably shorter than the second enable interval. The column select control signal preferably ends at the same time for both the read and write operations, but begins at different times for the read and write operations. The first and second delay circuits preferably produce pulses from the first combinatorial circuit, and the third and fourth delay circuits preferably produce pulses from the second combinatorial circuit.

A column select circuit according to the present invention may be combined with a conventional circuit which produces a column select signal from the column select control signal. The control signal may be applied to a pair of column select gates, so that the column select gates are responsive to the column select signal, to electrically connect a pair of bit lines to a pair of input/output lines. Read and write operations with a plurality of read/write memory cells are thereby provided.

Column select methods according to the present invention, delay and logically combine an enable signal and a write control signal. The logically combined enable and write control signals are delayed to produce a first signal. The first signal and the delayed enable signal are logically combined to produce a second signal. The second signal is delayed to produce a third signal. The second signal is also logically combined with a delayed write control signal to produce a fourth signal. The second and fourth signals are logically combined to produce a fifth signal. The fifth signal is delayed to produce a sixth signal. The second signal and the sixth signal are logically combined to produce a seventh signal. The seventh signal is delayed to produce the column select control signal which is responsive to the write control signal as well as to the enable signal.

In methods according to the present operation, the delaying steps may be adjusted to produce a column select control signal which has a first enable interval during a read operation and a second enable interval during a write operation. The write enable interval is preferably longer than the read enable interval. The column select control signal is used to produce a column select signal which is applied to column select gates, to thereby connect and disconnect bit lines from input/output lines during read and write operations.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
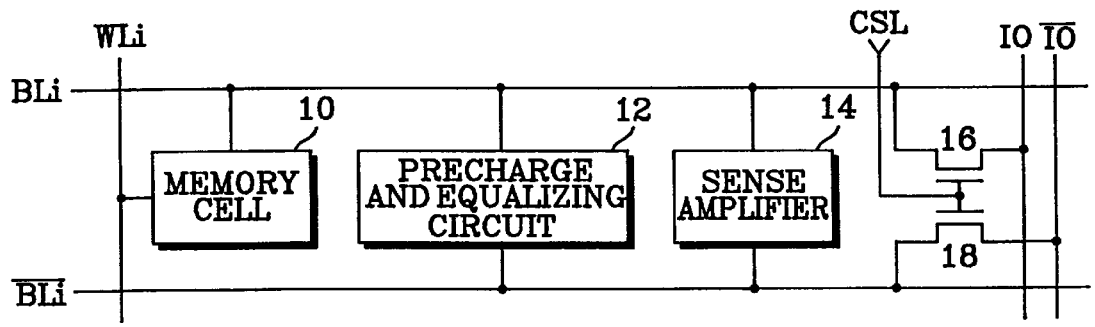
FIG. 1 is a schematic block diagram of a portion of an integrated circuit memory device.
Figure 2:
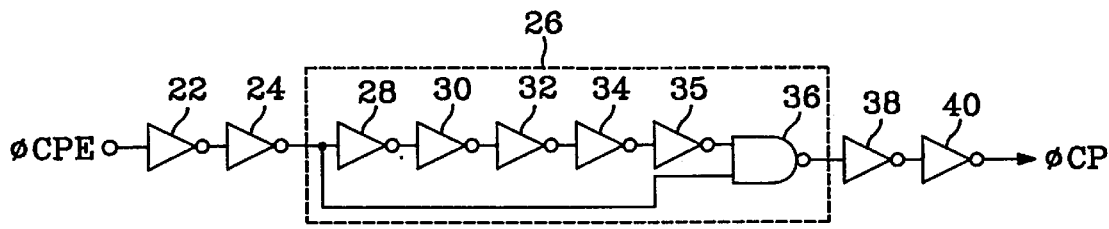
FIG. 2 is a logic block diagram illustrating a conventional column select signal control circuit.
Figure 3:
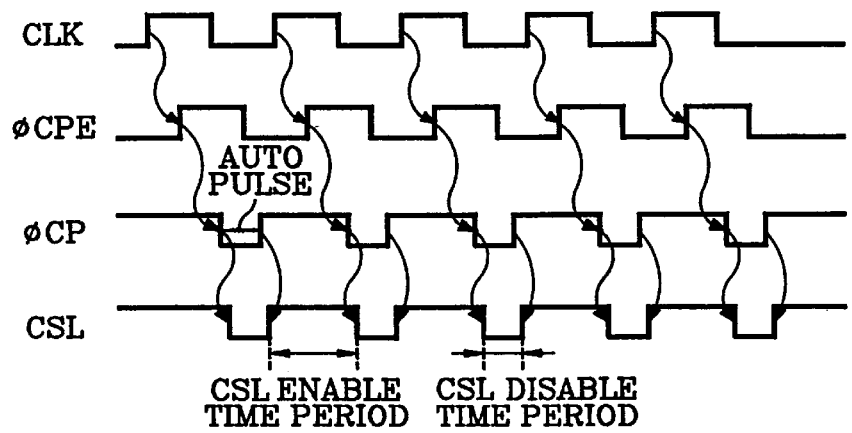
FIG. 3 is a timing diagram illustrating operations of the circuit of FIG. 2.
Figure 4:
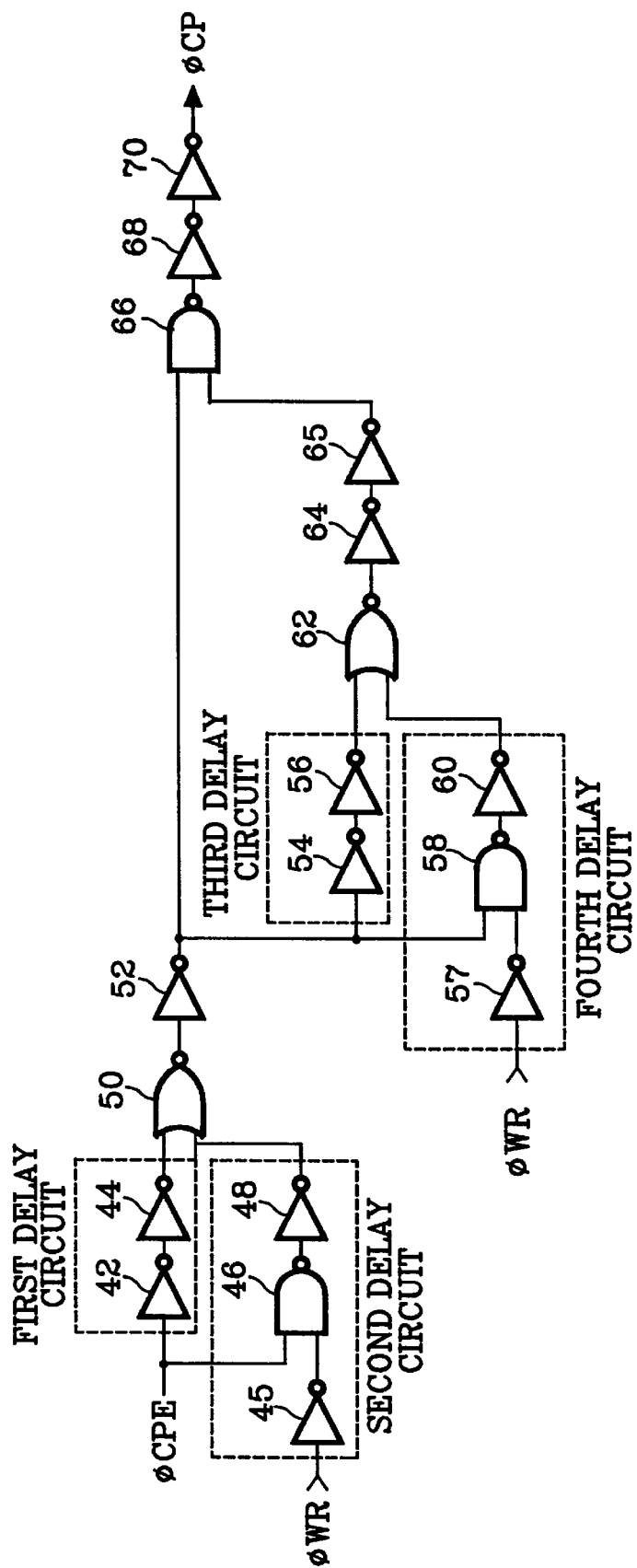
FIG. 4 is a logic block diagram illustrating a column select signal control circuit according to the present invention.

Referring now to FIG. 4, a logic block diagram of a column select circuit according to the present invention will now be described. Enable signal φCPE is connected to inverter 42 and to NAND gate 46. A write control signal φWR is connected to the input of inverter 45. The output of inverter 45 is also connected to NAND gate 46. The output terminal of inverter 42 is connected to the input terminal of inverter 44 and the output terminal of NAND gate 46 is connected to the input terminal of inverter 48. Accordingly, inverters 42 and 44 form a first delay circuit which delays the enable signal φCPE for a predetermined time. Inverter 45, NAND gate 46 and inverter 48 form a second delay circuit which logically combines the enable signal and the write control signal and delays the logically combined enable signal and write control signal.

Still referring to FIG. 4, the outputs of the first delay circuit and the second delay circuit are connected to the input terminals of NOR gate 50 which forms a first combinatorial circuit which is responsive to the first delay circuit and to the second delay circuit, to logically combine the outputs of the first and second delay circuits. The output terminal of the NOR gate 50 is connected to the input terminal of an inverter 52.

Continuing with the description of FIG. 4, the write control signal φWR is also connected to the input terminal of inverter 57. The output terminals of inverters 57 and 52 are connected to the input terminals of NAND gate 58. The output terminal of inverter 52 is also connected to the input terminal of the inverter 54. The output terminal of inverter 54 is connected to the input terminal of inverter 56, and the output terminal of NAND gate 58 is connected to the input terminal of inverter 60. Accordingly, inverters 54 and 56 form a third delay circuit which is responsive to the first combinatorial circuit, to delay the output of the first combinatorial circuit. Inverter 57, NAND gate 58 and inverter 60 form a fourth delay circuit which is responsive to the write control signal and to the first combinatorial circuit, to logically combine the write control signal and the output of the first combinatorial circuit, and to delay the logically combined write control signal and the output of the first combinatorial circuit.

Still referring to FIG. 4, the third delay circuit and the fourth delay circuit are connected to the input terminals of a second combinatorial circuit, in the form of NOR gate 62, which is responsive to the third delay circuit and to the fourth delay circuit, to logically combine the outputs of the third and fourth delay circuits. The output terminal of the NOR gate 62 is connected to the input terminal of an inverter 64 which is in turn connected to an inverter 65. The output terminals of inverters 65 and 52 are each connected to the input terminals of a NAND gate 66. NAND gate 66 forms an output circuit which is responsive to the first and second combinatorial circuits, to logically combine the outputs of the first and second combinatorial circuits, to thereby produce a column select control signal which is responsive to the control signal as well as to the enable signal. Finally, as shown in FIG. 4, the output terminal of NAND gate 66 is connected to the input terminal of inverter 68. Inverter 68 is in turn connected to inverter 70 to produce the control signal φCP at the output thereof.

Figure 5:
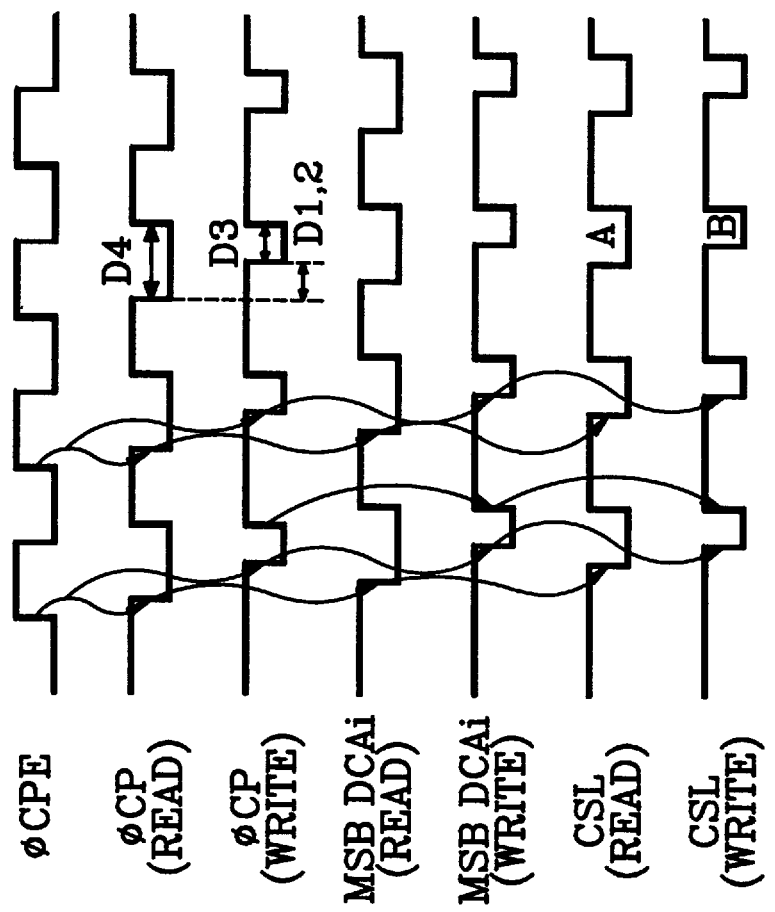
FIG. 5 is a timing diagram illustrating operations of the circuit of FIG. 4.

FIG. 5 is a timing diagram illustrating operations of FIG. 4. When the enable signal φCPE is activated by the combination of an external clock signal CLK (not shown) and column predecoding information, and the write control signal φWR is activated, the control signal φCP is output as a pulse signal. The logic state of the write control signal φWR is logic "low" during a read operation, and logic "high" during a write operation. Therefore, in contrast with a conventional circuit, since the control signal φCP according to the present invention is controlled by the write control signal φWR, it has different pulse widths during the read/write operations. This allows the activating interval of the column select signal CSL to be enlarged during a write operation.

Figure 6:
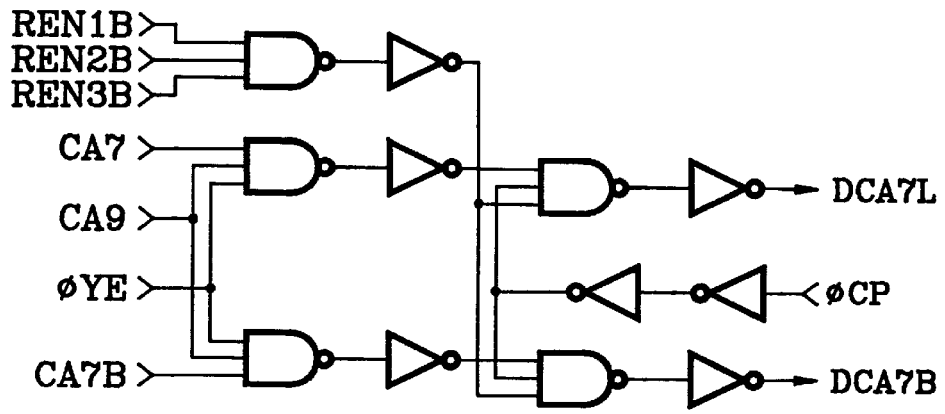
FIG. 6 is a logic block diagram illustrating a conventional column predecoder.
Figure 7:
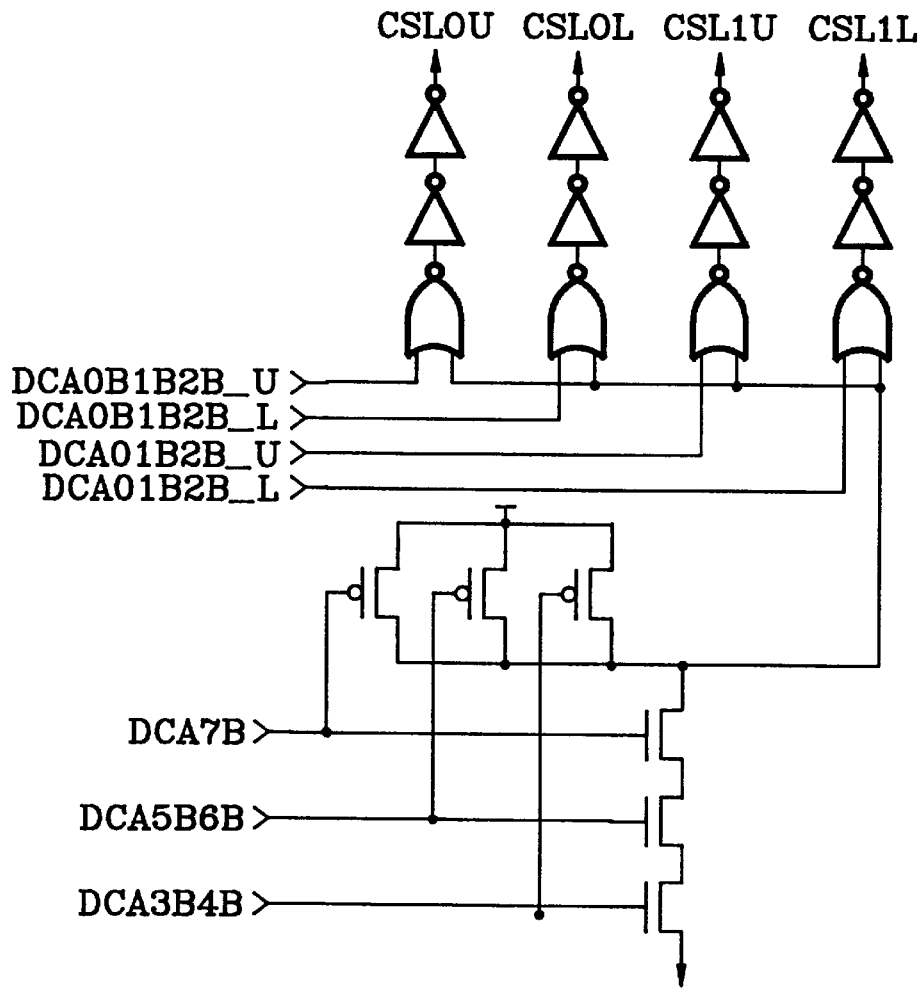
FIG. 7 is a logic block diagram illustrating a conventional column decoder.

In particular, the enable signal φCPE and the write control signal φWR are all at logic "low" states during the precharge interval. During a read operation, the enable signal φCPE periodically supplies a logic "high" signal and the write control signal φWR maintains a logic "low" state. The control signal φCP is output as an inverted logic "low" state of the enable signal φCPE. An auto pulse at logic "high" is thus generated, and as shown in FIGS. 6 and 7, the column select signal CSL holds the logic "high" state during the auto pulse interval of the logic "high" state. The "high" state pulse width is similar to the logic "low" interval of the enable signal φCPE.

During a write operation, the enable signal φCPE periodically supplies logic "high" state and the write control signal φWR maintains logic "high" state. The logic "low" level interval of the control signal φCP is affected by the first, second and third delay circuits and is shortened compared to the read operation. As a result, the logic "low" level interval of the control signal φCP during the write operation is shortened compared to the read operation, as shown in FIG. 5. Thus, since the circuit, including delay circuits and pulse generating circuits, generates variable pulses in response to the write control signal φWR, the enable intervals during the read/write operations differ from each other.

The activating intervals of the column select signal CSL during the read/write operations differ from each other due to the control signal φCP having a variable width, as produced by the column select signal control circuit. As shown in FIG. 5, the interval "B" is shorter than the interval "A". Thus, the logic "high" interval during the write operation is longer than that during the read operation. As the logic "low" level width of the control signal φCP is variably controlled during the read/write operations, the column select signal CSL can have different activating widths during the read/write operations. Therefore, the column select signal CSL is enabled for a sufficient duration during the write operation, to reduce errors which may occur during the write operation, and thereby provide stable operation of the integrated circuit memory device.

Referring again to FIG. 4, a column select method for a read/write memory device delays an enable signal using the first delay circuit. The enable signal and a write control signal are logically combined. The logically combined enable signal and write control signal are delayed to produce a first signal at the output of inverter 48. The delayed enable signal and the first signal are logically combined to produce a second signal at the output of NOR gate 50. The second signal is delayed to produce a third signal at the output of inverter 56. The second signal is also logically combined with the write control signal by NAND gate 58 to produce a fourth signal at the output of inverter 60. The third signal and the fourth signal are also logically combined to produce a fifth signal at the output of NOR gate 62. The fifth signal is delayed to produce a sixth signal at the output of inverter 65. The second signal and the sixth signal are logically combined by NAND gate 66 to produce a seventh signal at the output thereof. The column select control signal φCP is produced from the seventh signal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A column select circuit for a read/write memory device, comprising:

a first delay circuit which is responsive to an enable signal to delay the enable signal;

a second delay circuit which is responsive to the enable signal and to a write control signal, to logically combine the enable signal and the write control signal and to delay the logically combined enable signal and write control signal;

a first combinatorial circuit which is responsive to the first delay circuit and to the second delay circuit, to logically combine the outputs of the first and second delay circuits;

a third delay circuit which is responsive to the first combinatorial circuit to delay the output of the first combinatorial circuit;

a fourth delay circuit which is responsive to the write control signal and to the first combinatorial circuit, to logically combine the write control signal and the output of the first combinatorial circuit and to delay the logically combined write control signal and output of the first combinatorial circuit;

a second combinatorial circuit which is responsive to the third delay circuit and to the fourth delay circuit, to logically combine the outputs of the third and fourth delay circuits; and an output circuit which is responsive to the first and second combinatorial circuits, to logically combine the outputs of the first and second combinatorial circuits to thereby produce a column select control signal which is responsive to the write control signal as well as to the enable signal.

2. A column select circuit according to claim 1 wherein the delays of at least one of the first, second, third and fourth delay circuits are selected to produce a column select control signal which is active for a first time duration during a read operation and which is active for a second time duration during a write operation.

3. A column select circuit according to claim 2 wherein the first and second time durations end at the same time for both the read and write operations, but begin at different times for the read and write operations.

4. A column select circuit according to claim 2 wherein the first time duration is shorter than the second time duration.

5. A column select circuit according to claim 1 wherein the first and second delay circuits produce pulses from the first combinatorial circuit, and wherein the third and fourth delay circuits produce pulses from the second combinatorial circuit.

6. A column select circuit according to claim 1 further comprising a circuit which produces a column select signal from the column select control signal.

7. A column select circuit according to claim 6 in combination with a pair of column select gates, a pair of bit lines and a pair of input/output lines, the column select gates being responsive to the column select signal to electrically connect the pair of bit lines to the pair of input/output lines.

8. A column select circuit according to claim 7 in further combination with a plurality of read/write memory cells connected between the pair of bit lines.

9. A column select circuit for a read/write memory device, comprising:

a combinatorial and delay circuit, which is responsive to an enable signal and to a read/write control signal, to produce a column select control signal which is active for a first time duration during a read operation and which is active for a second time duration during a write operation wherein the first time duration is shorter than the second time duration.

10. A column select circuit according to claim 9 wherein the first and second time durations end at the same time for both the read and write operations, but begin at different times for the read and write operations.

11. A column select circuit according to claim 9 wherein the combinatorial and delay circuit includes at least two parallel delay circuits which provide inputs to a combinatorial circuit, to thereby produce pulses.

12. A column select circuit according to claim 9 wherein the combinatorial and delay circuit includes a plurality of interconnected logic gates and inverters.

13. A column select circuit according to claim 9 in combination with a pair of column select gates, a pair of bit lines and a pair of input/output lines, the column select gates being responsive to the column select control signal to electrically connect the pair of bit lines to the pair of input/output lines.

14. A column select circuit according to claim 13 in further combination with a plurality of read/write memory cells connected between the pair of bit lines.

15. A column select method for a read/write memory device, comprising the step of:

combining and delaying an enable signal and a read/write control signal, to produce a column select control signal which is active for a first time duration during a read operation and which is active for a second time duration during a write operation wherein the first time duration is shorter than the second time duration.

16. A column select method according to claim 15 wherein the first and second time durations end at the same time for both the read and write operations, but begin at different times for the read and write operations.

17. A column select method according to claim 15 further comprising the step of applying the column select control signal to a pair of column select gates, to thereby electrically connect a pair of bit lines to a pair of input/output lines.

18. A column select method according to claim 15 wherein the logically combining and delaying step comprises the steps of:

delaying the enable signal;

logically combining the enable signal and the write control signal to produce a first signal;

logically combining the delayed enable signal and the first signal to produce a second signal;

delaying the second signal to produce a third signal;

logically combining the write enable signal and the second signal to produce a fourth signal;

logically combining the third signal and the fourth signal to produce a fifth signal;

delaying the fifth signal to produce a sixth signal; and logically combining the second and the sixth signal to produce the column select control signal.

* * * * *